United States Patent [19]
Li

[11] Patent Number: 5,864,236
[45] Date of Patent: Jan. 26, 1999

[54] OPEN CONFIGURATION MRI MAGNETIC FLUX PATH

[75] Inventor: Andrew Li, South San Francisco, Calif.

[73] Assignee: Toshiba America MRI, Inc., Tustin, Calif.

[21] Appl. No.: 675,925

[22] Filed: Jul. 5, 1996

[51] Int. Cl.⁶ ........................................ G01V 3/00
[52] U.S. Cl. ............................ 324/320; 324/319
[58] Field of Search ................. 324/320, 319, 324/318, 322; 128/653.5; 335/296, 299

[56] References Cited

U.S. PATENT DOCUMENTS

| | | | |
|---|---|---|---|
| 3,924,211 | 12/1975 | Ioffe et al. | 335/284 |
| 4,682,111 | 7/1987 | Hughes | 324/320 |
| 4,689,591 | 8/1987 | McDougall | 335/299 |
| 4,723,116 | 2/1988 | Muller et al. | 324/320 |
| 4,953,555 | 9/1990 | Leupold et al. | 128/653 |
| 5,134,374 | 7/1992 | Breneman et al. | 324/319 |
| 5,162,768 | 11/1992 | McDougall et al. | 335/296 |
| 5,384,538 | 1/1995 | Ohta et al. | 324/319 |
| 5,446,434 | 8/1995 | Dorri et al. | 324/320 |
| 5,517,121 | 5/1996 | Kaufman et al. | 324/320 |
| 5,519,372 | 5/1996 | Palkovich et al. | 335/216 |

FOREIGN PATENT DOCUMENTS

| | | |
|---|---|---|
| 0 609 604 | 8/1994 | European Pat. Off. . |
| WO 90/05369 | 5/1990 | WIPO . |

*Primary Examiner*—Louis M. Arana
*Attorney, Agent, or Firm*—Nixon & Vanderhye P.C.

[57] ABSTRACT

An improved MRI magnet structure is created by utilizing a lower pole mounting support with one or more vertically extending yokes. The one or more vertically extending yokes mount an upper pole mounting structure including an upper pole mounting ring and at least one spoke connecting the ring to at least one of the vertically extending structural supports. The average effective spacing of the upper pole mounting structure is greater than the air gap between the upper and lower pole thereby resulting in improved uniformity of the $B_o$ field at the patient imaging volume. In a preferred embodiment, a pie-shaped cryostat encompasses a plurality of radially distributed superconducting electromagnets for generating a more uniform field in the patient imaging volume. The patient imaging field uniformity in some embodiments can be improved by the use of shim coils and/or shim rings associated with either the upper or lower poles to further modify the field within the patient imaging volume.

35 Claims, 4 Drawing Sheets

OPEN CONFIGURATION MRI MAGNETIC FLUX PATH

CROSS-REFERENCES TO RELATED APPLICATIONS

This invention is related to the following commonly assigned U.S. patents:

1. U.S. Pat. No. 4,829,252—Kaufman, "MRI SYSTEM WITH OPEN ACCESS TO PATIENT IMAGE VOLUME" filed Oct. 28, 1987 and issued May 9, 1989;

2. U.S. Pat. No. 4,885,542—Yao et al., "MRI COMPENSATED FOR SPURIOUS NMR FREQUENCY/PHASE CHANGES CAUSED BY SPURIOUS CHANGES IN MAGNETIC FIELDS DURING NMR DATA MEASUREMENT PROCESS" filed Apr. 14, 1988 and issued Dec. 5, 1989;

3. U.S. Pat. No. 5,317,297—Kaufman et al., "MRI MAGNET WITH ROBUST LAMINATED MAGNETIC CIRCUIT MEMBER AND METHOD OF MAKING SAME" filed Apr. 13, 1990 and issued May 31, 1994;

4. U.S. Pat. No. 5,227,728—Kaufman et al.; "GRADIENT DRIVER CONTROL IN MAGNETIC RESONANCE IMAGING" filed Nov. 1, 1991 and issued Jul. 13, 1993; and 5. U.S. Pat. No. 5,250,901—Kaufman et al.; "OPEN ARCHITECTURE IRON CORE ELECTROMAGNET FOR MRI USING SUPERCONDUCTIVE WINDING" filed Nov. 7, 1991 and issued Oct. 5, 1993.

The entire contents of each of the above-identified related commonly assigned U.S. patents is herein incorporated by reference.

BACKGROUND OF THE INVENTION

1. Field of the Invention

The present invention generally relates to magnetic resonance imaging (MRI) utilizing nuclear magnetic resonance (NMR) phenomena. More particularly, this invention is directed to a novel MRI magnet flux path for use in an MRI system.

2. Description of the Prior Art

A detailed discussion of the existing prior art with respect to MRI magnetic flux path and the upper and lower poles and their interconnection to provide the necessary flux return path is set forth in the above prior art patents. As noted in the prior art, a great variety of MRI systems are now commercially available and they vary greatly in design criteria as well as purchase, installation and operating costs.

As discussed in U.S. Pat. No. 5,250,901 (hereinafter the '901 patent"), and as shown in FIG. 4 thereof, the cost of an MRI magnet generally increases as the required magnetic field strength increases if a permanent magnet is used to provide the $B_o$ field. However, if a traditional superconductive magnet is used, the higher initial cost is overcome at the higher field strengths. For the purposes of this discussion, a "low" strength field is one in the range of 0.00 T up to 0.3 T, a medium magnetic field strength is from 0.3 T to about 1.0 T and a high strength field is one having a field strength greater than 1.0 T and, in particular, field strengths of 1.50 T or greater.

Conventional wisdom is that the signal to noise ratio (S/N) of an MRI system is proportional to the magnetic strength of the $B_o$ field, but various improved signal processing procedures have permitted high S/N with relatively low strength fields. The Assignee of the present invention makes a series of highly successful permanent magnet MRI systems which are characterized by a low field strength. In such systems, the static magnetic $B_o$ field is created by a permanent magnet and the magnetic flux return path between pole faces comprises a series of vertically extending yokes which support and space apart the upper and lower poles. These vertically extending yokes are the only structure surrounding a patient located in the patient imaging volume.

One advantage of the above such systems, as discussed in the previous patents, is that the expense of maintaining a superconductive or resistive electromagnet is avoided. A further advantage is to alleviate to a large extent any patient discomfort caused by a claustrophobic reaction to conventional prior art MRI magnets using air as the magnetic circuit medium. An additional advantage of such open architecture is that easy access to the patient is provided during MRI scanning. This access facilitates the implementation of surgical procedures and/or patient diagnosis during MRI scanning.

Even with the advent of more sophisticated signal processing to provide improved S/N with the low field MRI systems, it is desirable to provide a medium field power system which, when combined with the advanced signal processing, provides a resolution equal to or greater than previous high power MRI systems. Unfortunately, the cost and weight of permanent magnets renders it impractical to use permanent magnets to provide the $B_o$ field with a field strength above 0.3 T. Consequently, the inductry has generally turned to superconducting materials to form high current, high magnetic field electric magnets with suitable iron cores to conduct the magnetic flux through the patient imaging volume. Because relatively high critical temperature ($T_c$) (77° k or higher) superconducting materials may become available and higher temperature superconducting materials are being developed, the use of the term "superconducting material" in this application encompasses all superconducting materials currently known and those developed in the future, regardless of their critical temperatures.

Existing superconductor electromagnetics are generally located and associated with both the upper and lower poles so as to generate a homogeneous magnetic field in the air gap between the pole faces, especially in the region of the patient imaging volume. Unfortunately, a consequence of the different locations of the two superconducting electromagnetics is the requirement of two separate cryostats, one for each electromagnet, along with the necessary linkage structure for linking the two electromagnet coils together and their associated linkage cryostat. Accordingly, as disclosed in the '901 patent, discussed above, an improvement in operating efficiency can be made if only a single cryostat is used to house all windings of the superconducting electromagnet (see FIG. 7 in the '901). However, the utilization of only a single cryostat causes some difficulties with respect to the uniformity of the magnetic field through the patient imaging volume.

One critical tradeoff requirement of MRI systems is the spacing between pole faces. In order to maintain the highest possible magnetic field strength, the pole faces should be very close together. However, the spacing between the pole faces must be sufficient for a patient or the object being imaged to be comfortably inserted into the field. This air gap distance between pole faces is conventionally on the order of 60 cm. In order to maintain a highly permeable flux path and to avoid saturation (and consequent reduction in the magnetic flux across the air gap), a rather substantial flux return path is provided between the pole faces.

Where a single cryostat embodiment is shown in the prior art (see FIG. 7 of the '901 patent), a substantial flux return path is provided so as to avoid saturation while at the same time maintaining a relatively high strength field. Unfortunately, and especially so with respect to a single superconducting electromagnet as shown in the prior art, the static magnetic $B_o$ field in the patient imaging volume can be relatively non-homogeneous and requires well-known shim coils or shim irons (a resistive coil or circle of iron placed adjacent the superconducting magnet to modify the field between the upper and lower poles).

To avoid the need for separate cryostats, the shim coils are generally resistive electromagnets, rather than superconducting electromagnets, further adding to the electrical power requirements of the system and generating additional heat which must then be removed from the system in order to avoid discomfort to the patient or damage to the operation of the magnet.

SUMMARY OF THE INVENTION

The present Applicants have found that the homogeneity of the field in the patient imaging volume is related to the amount of material supporting the upper pole as well as the spacing of this supporting material from the lower pole. While the pole face spacing itself, as discussed above, needs to remain on the order of 60 cm, the structure supporting the upper pole can be physically displaced away from the lower pole. The effective spacing can be further increased by removing a portion of the upper pole mounting structure leaving one or more spokes to support the upper pole and to magnetically connect it to the supporting yokes.

In a preferred embodiment of the present invention, a superconductive electromagnet (in a preferred embodiment a superconductive magnet) is located in a pie-shaped cryostat where the magnet is comprised of three radially displaced sets of coils forming a distributed magnetic field. At least one vertically extending yoke mounts an upper pole mounting structure to the lower pole mounting structure upon which the single pie-shaped cryostat is located. The upper pole mounting structure comprises at least one radially extending spoke, the spoke associated with a respective vertically extending yoke and supporting the upper pole above an air gap between the pole faces.

In further preferred embodiments, the MRI static magnetic $B_o$ field is modified by one or more field modifying structures, such as a shim coil and/or a shim ring, for adjusting the field to be homogeneous throughout said patient imaging volume.

The use of a single pie-shaped cryostat, which encompasses all superconducting electromagnet coils, eliminates both the need for a second cryostat and for the connective cryostat structure disclosed in conventional medium and high strength field MRI systems. This single cryostat reduces coolant consumption (because there is a decrease in the total surface to total volume ratio) and permits the electromagnet windings to be distributed at more than one radial location to avoid non-homgeneity in the resulting static magnetic field which might otherwise be present due to the single cryostat. The use of vertically extending yokes and a spoked upper pole mounting structure permits greater patient access, as well as patient comfort. At the same time, the yoke and spoke combination provides an increase in the effective upper pole face mounting structure distance from the lower pole face resulting in an improvement in field homogeneity over the patient imaging volume.

BRIEF DESCRIPTION OF THE DRAWINGS

The above, as well as other advantages and features of this invention, will be more completely understood and appreciated by review of presently preferred exemplary embodiments taken in conjunction with the accompanying drawings, of which.

DETAILED DESCRIPTION OF PREFERRED EMBODIMENTS

In discussion of the preferred embodiments illustrated in the accompanying drawings, similar numbering will be used for similar structures among these several views.

Figure 1:
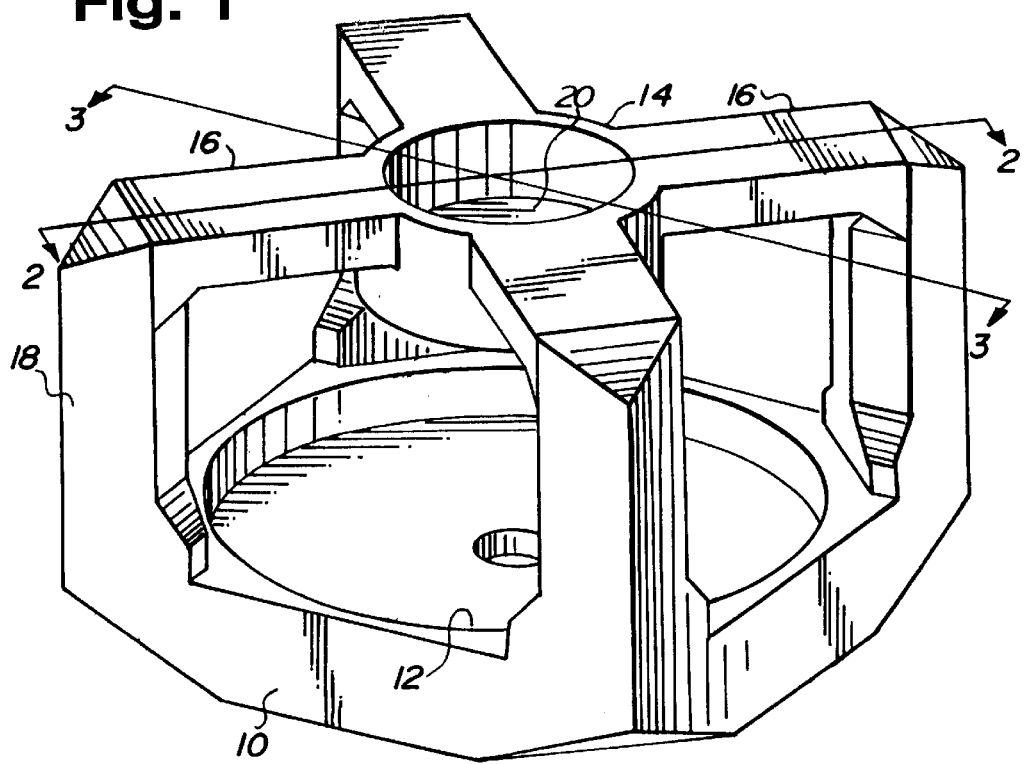
FIG. 1 is a side perspective view of a preferred embodiment of the present invention.

FIG. 1 illustrates one preferred embodiment of the present invention. A lower pole mounting structure 10 includes a generally circular recess 12 in which a pie-shaped cryostat may be located (not illustrated in FIG. 1 but shown in FIG. 2). An upper pole mounting structure comprising ring 14 and spokes 16 are supported by yokes 18 vertically extending from said lower pole mounting structure 10. The upper pole 20 is located in conjunction with ring 14. Although in FIG. 1 the MRI magnet structure is illustrated by numerous flat planes whose intersection comprises relatively sharp angles, it is understood that the various edges could be rounded off and/or modified to improve homogeneity of the static magnetic $B_o$ field in the area of the patient imaging volume. Additionally while the four yokes are shown symmetrically about the ring 14, they could be asymetrically placed perhaps to provide even more patient access on one side of the patient imaging volume. More detail of the preferred embodiment of the MRI magnet structure shown in FIG. 1 may be appreciated by review of FIG. 2.

Figure 2:
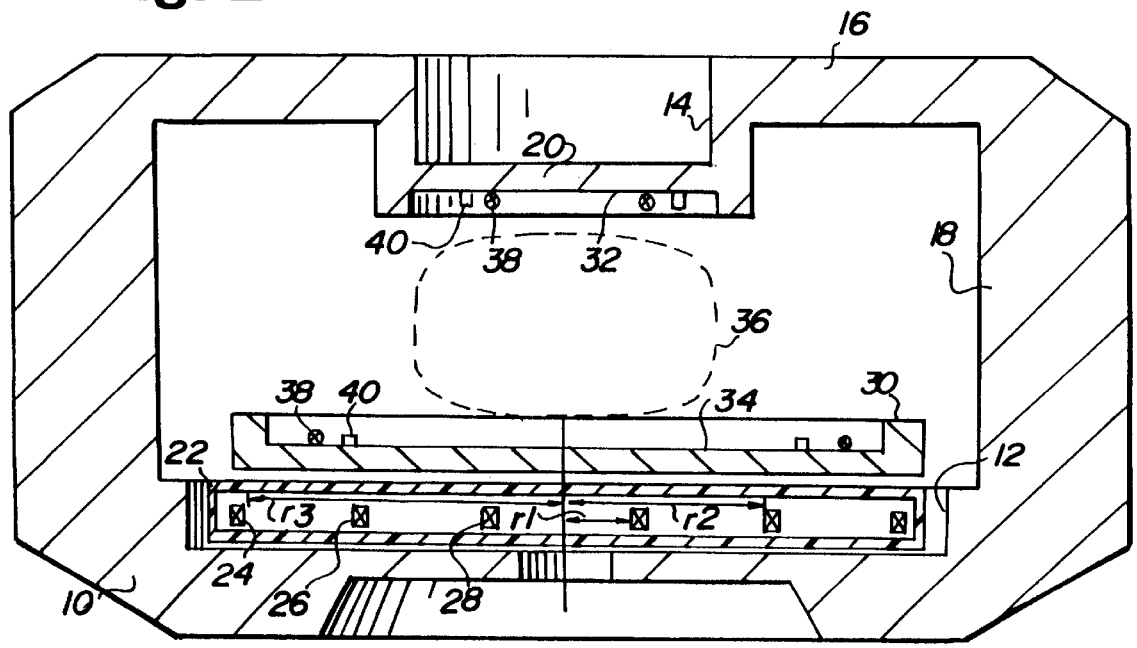
FIG. 2 is a cross-sectional view of the embodiment of FIG. 1 taken along section lines 2—2 showing the cross-section of the upper pole face mounting structures.
Figure 4:
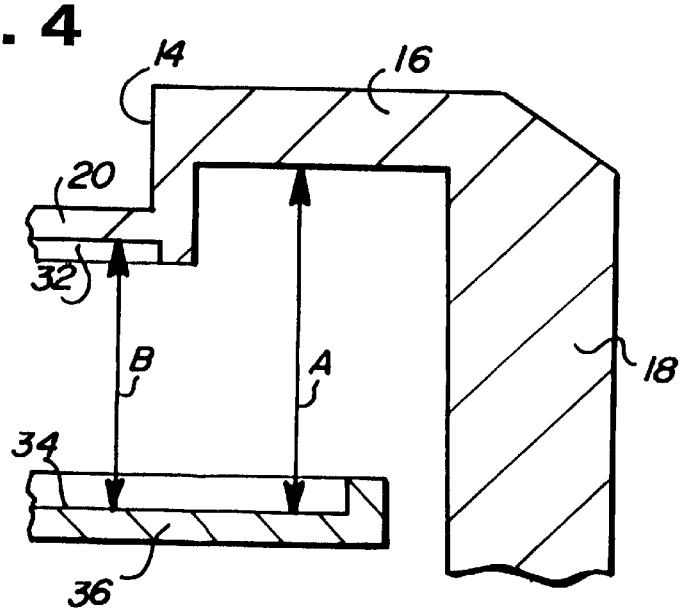
FIG. 4 is a cross-sectional view of a portion of FIG. 2 illustrating a greater spacing between the lower pole face and the upper pole mounting structure than the spacing between the upper and lower pole faces.

FIG. 2 includes a pie-shaped cryostat containing high $T_c$ superconductive electromagnets 24, 26 and 28. The coil windings of the electromagnets are cooled in a conventional manner so as to maintain their superconducting properties and generate a desired MRI static magnetic $B_o$ field. This field is somewhat modified by the lower pole 30 which is spaced apart from the upper pole 20 by an air gap distance "B" as shown in FIG. 4. The upper and lower poles have upper and lower pole faces 32 and 34, respectively. Between the upper and lower pole faces is defined a patient imaging volume 36 as generally indicated by dotted line 36. As is well-known, it is desirable to have the static magnetic field $B_o$ as uniform and homogeneous as possible at least within the space of the patient imaging volume 36.

One significant feature distinguishing the present invention from prior MRI magnet structures is the absence of a solid upper pole mounting structure. This solid pole mounting structure can be seen in FIG. 7 of the '901 in which the upper pole mounting structure is the same area as the lower pole mounting structure. While it is generally desirable to maintain the air gap distance B around 60 cm (this distance being a compromise between a closer spacing to increase the magnetic field and a further distance providing greater access and less claustrophobia to the patient located in the patient imaging volume) applicants have found that the presence of the upper pole mounting structure significantly deteriorates the uniform nature of the magnetic field in the patient imaging volume.

Applicants have additionally found that moving the pole supporting structure away from the lower pole face provides substantial improvements in the uniformity of the magnetic field in the region of the patient imaging volume 36. This greater actual spacing, between the upper pole mounting structure and the lower pole, increased as shown in FIG. 4 to an actual spacing A which is greater than the air gap B, results in a substantive improvement to the homogeneity of the field in the patient imaging volume. Accordingly, even if a horizontally solid upper pole mounting structure were used, merely locating it a further distance from the lower pole face 34 would serve to improve the uniformity of the magnetic field in the patient imaging volume.

Figure 3:
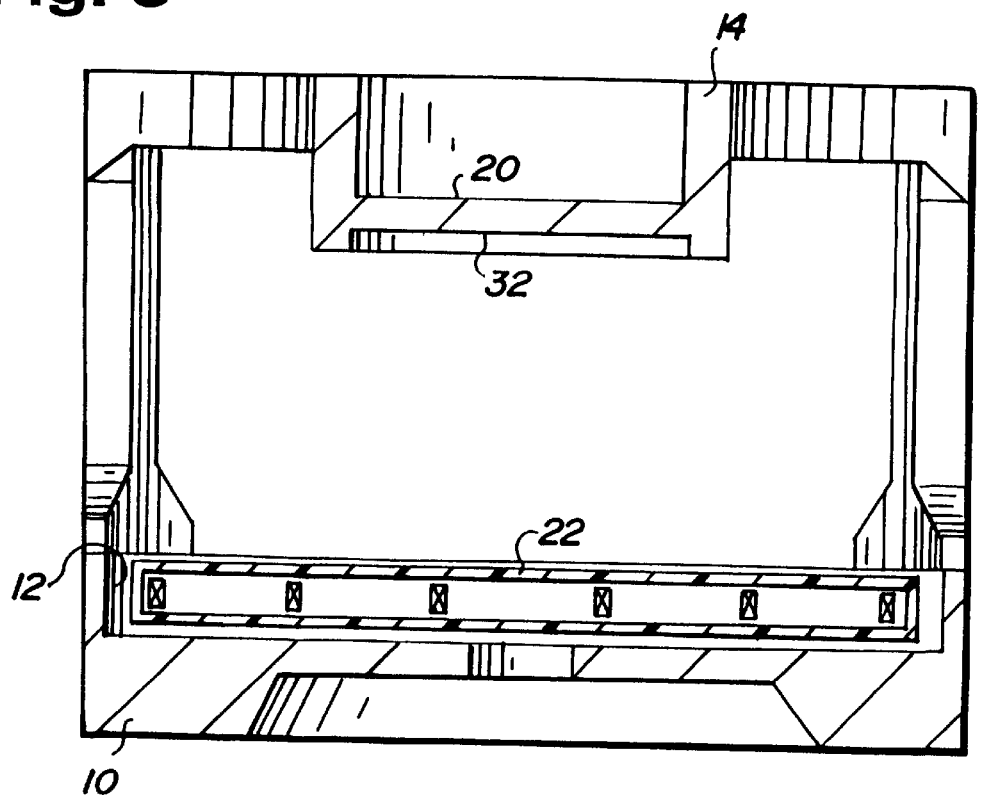
FIG. 3 is a cross-sectional view of FIG. 1 taken along sections 3—3 illustrating the upper pole mounting structure without mounting spokes in relation to the lower pole mounting structure.

Moreover, Applicant has also found that where there is an air return path (no iron flux return circuit), adjacent a portion of ring 14 of the upper pole mounting structure (as shown in FIG. 3), the result is to effectively increase the spacing between the remainder of the upper pole mounting structure and the lower pole to a distance even larger than dimension A shown in FIG. 4. Accordingly, where the upper pole mounting structure includes a series of spokes which are located at distance A from the lower pole face, the average effective spacing (the average of the actual spoke spacing from the lower pole and the effective increase in spoke spacing due to the air gap in the absence of spokes) is significantly greater than distance A shown in FIG. 4. Accordingly, the use of less than a solid upper pole mounting structure, i.e., one or more spokes to mount and support ring 14, results in a dramatic increase in the average effective spacing between the upper pole mounting structure and the lower pole 30, and a concurrent increase in the homogeneity of the static field.

Figure 5A:
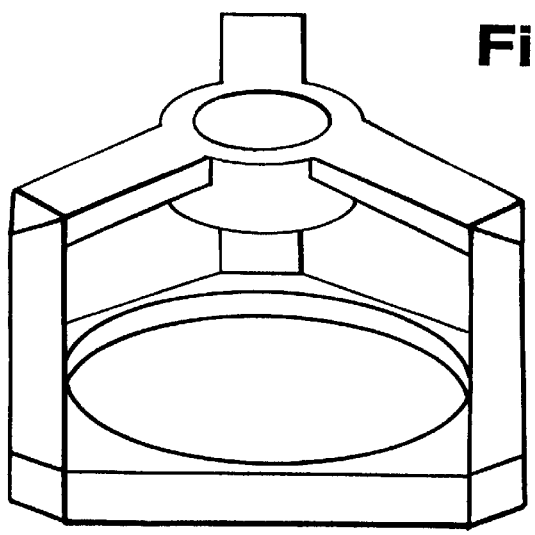
FIGS. 5A–5C illustrate three, two and one spoke alternative embodiments, respectively, of the upper pole mounting structure in accordance with the present invention.
Figure 5B:
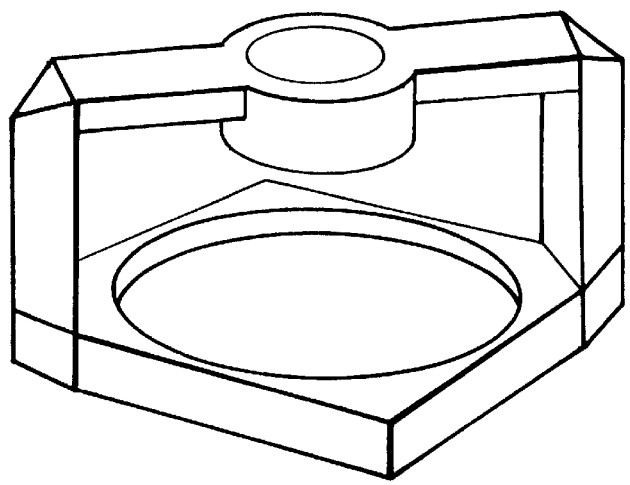
Figure 5C:
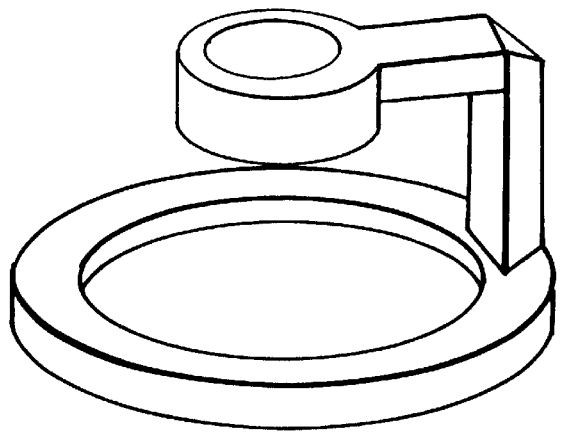

FIGS. 5A–5C teach alternative spoked mounting structures in addition to the preferred embodiment illustrated in FIG. 1. As will be clear to one of ordinary skill in the art in view of the above disclosure, further improvement in the magnetic field in the imaging volume could be provided if no spoke were used to support the upper pole mounting structure ring 14. However, the absence of a high permeability flux return path in the spoke and yoke (between the upper and lower poles) would severely reduce the field strength thereby adversely effecting resolution with the MRI system. In all present embodiments, a high permeability iron core is used for the upper and lower pole mounting structures, the vertically extending yokes and the upper pole mounting structure including ring 14 and spokes 16. It goes without saying that the spokes 16 and the vertically extending yokes 18 must be sufficiently strong to support the weight of ring 14 and upper pole face 20 as well as the attractive forces of the poles. Even though illustrated as symetrically located, the spokes and associated vertical yokes could be asymetrically located so as to provide even greater patient access. Additionally, they should be sufficiently large in cross-section to carry the magnetic flux generated by the single magnet without reaching flux saturation.

As will be clear to one of ordinary skill in the art, increases in the distance between the spokes 16 and the lower pole 30 provide additional improvements in field uniformity but at a cost of increased weight and volume of the MRI magnet structure. Also, while the embodiments illustrated in the drawings show spacing A to be greater than spacing B, spacing A could also be the same as or even slightly less than B, as long as in combination with the reduction in solidity of the upper pole mounting structure (the use of spokes instead of a solid structure), the average effective spacing is greater than the air gap B.

FIG. 2 illustrates a distribution of three separate high $T_c$ superconducting electromagnets 24, 26 and 28, each having a different radial spacing, $r_1$, $r_2$ and $r_3$ from the approximate center of symmetry of the electromagnet. Of course, only a single superconducting coil is needed to generate the static field through the patient imaging volume. However, Applicant has found that a distributed electromagnet located over a plurality of different radial spacings provides the ability to tailor the static magnetic field in a more uniform manner throughout patient imaging volume 36. The number of windings in each of electromagnets 24, 26 and 28 can vary so that the field generated by each varies in a desired manner.

FIG. 2 also illustrates the existence of the location of lower pole face 30 above the electromagnet which is believed to provide the most efficient generation of the uniform static field in the patient imaging volume. However, in some circumstances, it may be desirable to locate the lower pole below the cryostat and the superconducting electromagnets.

Even with the relatively uniform field provided by the above-disclosed MRI magnet structure, it may be necessary to slightly modify the field by the use of at least one MRI static magnetic $B_o$ field modifying structure such as one or more shim coils 38 and/or shim rings 40 to adjust the field in a known manner shown in FIG. 2. The shim coil 38 may be a non-superconducting electromagnet (a resistive electromagnet) whose position and energizing current is controlled to adjust the magnetic field in the patient imaging volume. The shim ring comprising a high permeability ring is adjustable in position only, and also serves to modify the flux field in the vicinity of the patient imaging volume.

Clearly, a variation in the size and radial positioning and spacing of the shim ring 40 and/or the shim coil 38 will vary the uniformity and modifications of the field in the patient imaging volume. Additionally, shim coils and/or shim rings could also be located in conjunction with the upper pole as shown in FIG. 2. At either upper or lower pole location, the shim coil 38 and shim ring 40 could be utilized by itself or in combination. Individual use of shim coils and shim rings in conjunction with either of the poles or in conjunction with both poles is envisioned.

While the pie-shaped cryostat 22 is utilized with the magnet structure shown in FIGS. 1 and 5A–5C, its use and the advantages thereof are not restricted to "spoked" arrangements of the upper pole mounting structure. The ability to create a distributed superconducting electromagnetic field could also be used with conventional upper pole mounting structures, such as that shown in FIG. 7 of the '901 patent, which use serves to render the static $B_o$ field in the patient imaging volume much more uniform.

Figure 6:
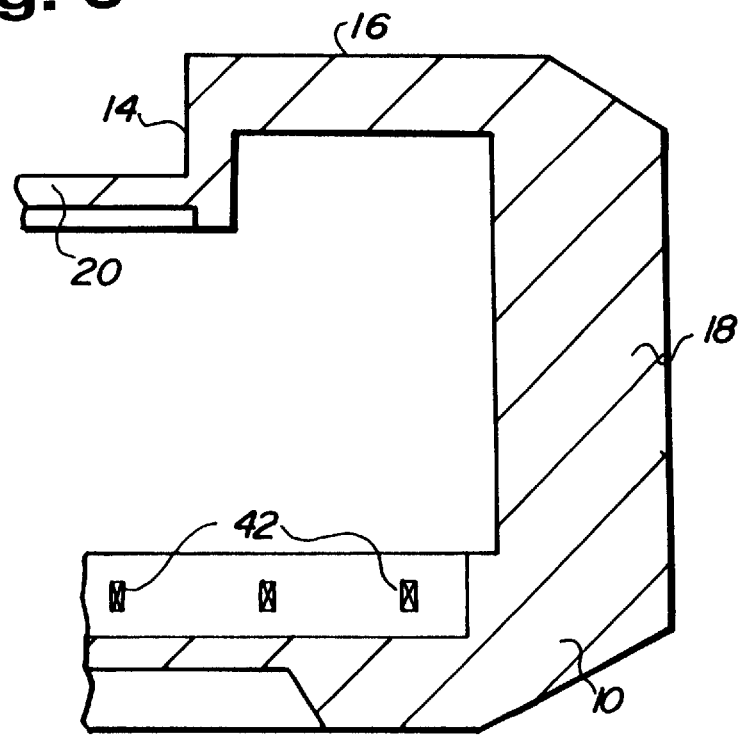
FIG. 6 illustrates a distributed resistive electromagnet embodiment of the present invention.
Figure 7:
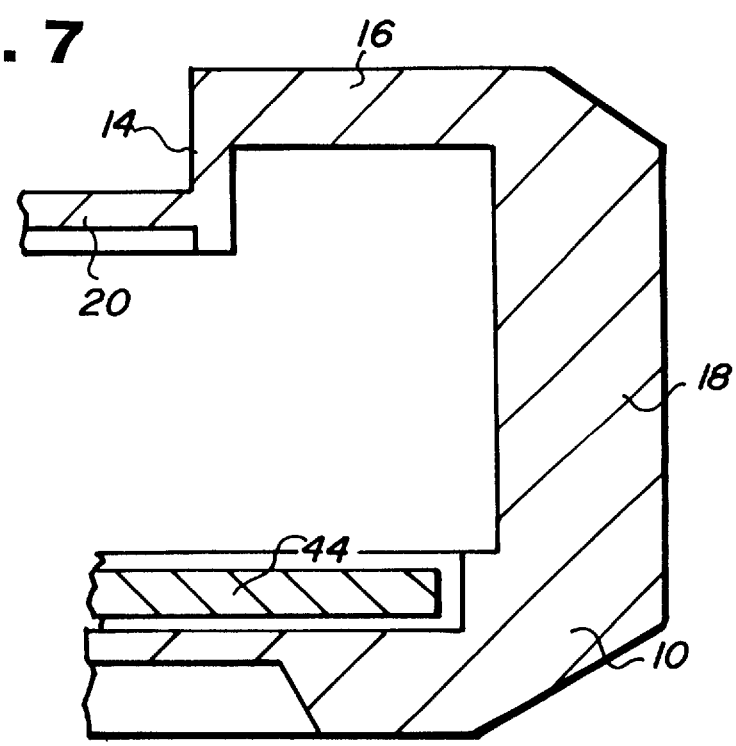
FIG. 7 illustrates a permanent magnet embodiment in accordance with the present invention.

Additionally, although a preferred embodiment of the MRI magnet structure having spokes utilizes a superconducting electromagnet, the advantages of this construction are also realizable with more conventional magnetic flux generating structures such as the resistive electromagnet 42 shown in FIG. 6 or the permanent magnet 44 shown in FIG. 7. Quite clearly, one or more shim coils and/or shim rings could also be used with the FIG. 6 and FIG. 7 embodiments to improve the uniformity of the field in the patient imaging volume. Additionally, the resistive electromagnet 42 and/or permanent magnet 44 could be utilized in conjunction with the flux return paths shown in FIGS. 5A–5C to provide patient imaging volumes having improved $B_o$ field uniformity.

While only a few exemplary embodiments of the present invention have been described in detail, those of ordinary skill in the art will appreciate that many variations and modifications may be made of these exemplary embodiments. For example, a greater number of spokes than the four spokes, as shown in the current figures, could be used to advantage, although generally a lesser number of spokes provides the more uniform magnetic field in the patient imaging volume. Additionally, different combinations of spokes and electromagnetic flux generators (high $T_c$ superconducting electromagnets, conventional superconducting electromagnets, resistive electromagnets and/or permanent magnets) could be utilized either by themselves or in combination with shim coils and/or shim rings to provide a highly uniform magnetic field in the vicinity of the patient imaging volume. Accordingly, all such variations and modifications are intended to be included within the scope of the appended claims.

What is claimed is:

1. An MRI magnet structure comprising:
a pair of magnetically permeable poles, said poles having faces opposingly disposed about an air gap, said air gap including a patient imaging volume, said pair of poles comprising upper and lower poles;
a magnetically permeable yoke structure providing a magnetic flux return circuit between said poles, said yoke structure including at least one aperture for access to said patient imaging volume, wherein said yoke structure includes an upper pole mounting structure for mounting said upper pole, said upper pole mounting structure having a non-solid structure in a horizontal plane and having an effective spacing from said lower pole face, wherein said effective spacing is greater than said air gap; and
a magnet associated with only said lower pole and magnetically coupled to generate a MRI static magnetic field $B_o$ within said imaging volume in said air gap.

2. An MRI magnet structure as in claim 1, wherein said magnet is a permanent magnet.

3. An MRI magnet structure as in claim 1, wherein said magnet is an electromagnet.

4. An MRI magnet structure as in claim 3, wherein said magnet is a superconductive electromagnet.

5. An MRI magnet structure as in claim 1, wherein said yoke structure comprises at least one structural support for said upper pole.

6. An MRI magnet structure as in claim 1, wherein said yoke structure comprises a plurality of structural supports for said upper pole.

7. An MRI magnet structure as in claim 6, wherein said yoke structure comprises two structural supports for said upper pole.

8. An MRI magnet structure as in claim 6, wherein said yoke structure comprises three structural supports for said upper pole.

9. An MRI magnet structure as in claim 6, wherein said yoke structure comprises four structural supports for said upper pole.

10. An MRI magnet structure as in claim 1, further including at least one MRI static magnetic $B_o$ field modifying structure.

11. An MRI magnet structure as in claim 10, wherein said at least one MRI static magnetic $B_o$ field modifying structure comprises at least one shim coil.

12. An MRI magnet structure as in claim 10, wherein said at least one MRI static magnetic $B_o$ field modifying structure comprises at least one shim ring.

13. An MRI magnet structure as in claim 10, wherein said at least one MRI static magnetic $B_o$ field modifying structure comprises a combination of at least one shim coil and at least one shim ring.

14. An MRI magnet structure as in claim 11, wherein at least one of said at least one shim coil is located in conjunction with said upper pole.

15. An MRI magnet structure as in claim 4, wherein said magnet includes a single cryostat for containing said superconductive electromagnet.

16. An MRI magnet structure as in claim 15, wherein said single cryostat comprises a pie-shaped cryostat.

17. An MRI magnet structure as in claim 16, wherein said cryostat includes a plurality of coils, at least one of which is a superconductive electromagnet.

18. An MRI magnet structure as in claim 17, wherein all of said plurality of coils comprise superconductive electromagnets.

19. An MRI magnet structure as in claim 18, wherein said plurality of coils are distributed at at least two different radii from a center of said lower pole face.

20. An MRI magnet structure as in claim 19, wherein said plurality of coils comprise three superconductive electromagnets and each of said three superconductive electromagnets is located at a different radius from said center of said lower pole face.

21. An MRI magnet structure as in claim 1, wherein said effective spacing said upper pole mounting structure is comprised of locating said upper pole face mounting structure at a distance from said lower pole face greater than said air gap.

22. An MRI magnet structure as in claim 1, wherein said effective spacing said upper pole mounting structure is comprised of said upper pole face mounting structure having a horizontal area less than a horizontal area of said lower pole face mounting structure.

23. An MRI magnet structure as in claim 1, wherein said effective spacing said upper pole mounting structure is comprised of locating said upper pole face mounting structure at a distance from said lower pole face greater than said air gap and said upper pole face mounting structure having a horizontal area less than a horizontal area of said lower pole face mounting structure.

24. An MRI magnet structure as in claim 23, wherein said upper pole face mounting structure comprises at least one spoke.

25. An MRI magnet structure as in claim 24, wherein said upper pole face mounting structure comprises two spokes.

26. An MRI magnet structure as in claim 24, wherein said upper pole face mounting structure comprises three spokes.

27. An MRI magnet structure as in claim 24, wherein said upper pole face mounting structure comprises four spokes.

28. An MRI magnet structure comprising:
a pair of magnetically permeable poles, said poles having faces opposingly disposed about an air gap, said air gap including a patient imaging volume, said pair of poles comprising upper and lower poles, each of said pole faces having an area;

a magnetically permeable yoke structure providing a magnetic flux return circuit between said poles, said yoke structure including at least one aperture for access to said patient imaging volume, wherein said yoke structure includes an upper pole mounting structure for mounting said upper pole, said upper pole mounting structure having an effective spacing from said lower pole face, wherein said effective spacing is greater than said air gap, said upper pole mounting structure comprised of four structural supports for said upper pole;

a single pie-shaped cryostat associated with said lower pole; and at least one superconductive electromagnet located in said single cryostat and magnetically coupled to said lower pole to generate a MRI static magnetic field $B_o$ within said imaging volume in said air gap.

29. An MRI magnet structure as in claim 28, wherein said at least one superconductive electromagnet comprises three superconductive electromagnets located in said single cryostat and each of said three superconductive electromagnets is located at a different radius from an approximate center of said lower pole face.

30. An MRI magnet structure as in claim 29, wherein said effective spacing said upper pole mounting structure is comprised of locating said upper pole face mounting structure at a distance from said lower pole face greater than said air gap and said upper pole face mounting structure having an area less than an area of said lower pole face mounting structure.

31. An MRI magnet structure comprising:

a pair of magnetically permeable poles, said poles having faces opposingly disposed about an air gap, said air gap including a patient imaging volume, said pair of poles comprising upper and lower poles, each of said pole faces having an area;

a magnetically permeable yoke structure providing a magnetic flux return circuit between said poles, said yoke structure including at least one aperture for access to said patient imaging volume, wherein said yoke structure includes an upper pole mounting structure;

a single pie-shaped cryostat associated with said lower pole; and a plurality of radially distributed superconductive electromagnets located in said single cryostat and magnetically-coupled to said lower pole to generate a MRI static magnetic field $B_o$ within said imaging volume in said air gap.

32. An MRI magnet structure as in claim 31, wherein said plurality of superconductive electromagnets comprises three superconductive electromagnets located in said single cryostat and each of said three superconductive electromagnets is located at a different radius from an approximate center of said lower pole face.

33. An MRI magnet structure as in claim 4, wherein said superconductive magnet is a high $T_c$ superconductive electromagnet.

34. An MRI magnet structure as in claim 29, wherein each of said three superconductive magnets is a high $T_c$ superconductive electromagnet.

35. An MRI magnet structure as in claim 32, wherein each of said three superconductive magnets is a high $T_c$ superconductive electromagnet.

* * * * *